US012620989B2

(12) United States Patent
Jang et al.

(10) Patent No.: US 12,620,989 B2
(45) Date of Patent: May 5, 2026

(54) POWER SUPPLY SWITCH CIRCUIT

(71) Applicant: SAMSUNG ELECTRO-MECHANICS CO., LTD., Suwon-si (KR)

(72) Inventors: Youngwong Jang, Suwon-si (KR); Jeonghoon Kim, Suwon-si (KR); Shinichi Iizuka, Suwon-si (KR); Jongok Ha, Suwon-si (KR); Hyejin Lee, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 839 days.

(21) Appl. No.: 17/862,466

(22) Filed: Jul. 12, 2022

(65) Prior Publication Data

US 2023/0109988 A1     Apr. 13, 2023

(30) Foreign Application Priority Data

Oct. 8, 2021     (KR) ........................ 10-2021-0133791

(51) Int. Cl.
| | |
|---|---|
| *H03K 17/687* | (2006.01) |
| *H02M 3/07* | (2006.01) |
| *H03F 3/24* | (2006.01) |

(52) U.S. Cl.
CPC .......... *H03K 17/6871* (2013.01); *H02M 3/07* (2013.01); *H03F 3/245* (2013.01); *H03F 2200/102* (2013.01); *H03F 2200/451* (2013.01)

(58) Field of Classification Search
CPC ............. H03K 17/6871; H03K 17/063; H03K 2217/0081; H02M 3/07; H03F 3/245; H03F 2200/102; H03F 2200/451; H03F 1/0244; H03F 1/0222; H03F 2200/249; H03F 2200/252; Y02D 30/70
USPC ........................................................ 330/108
See application file for complete search history.

(56) References Cited

U.S. PATENT DOCUMENTS

| | | | |
|---|---|---|---|
| 7,973,595 B2 | 7/2011 | Kimura | |
| 9,685,855 B2 * | 6/2017 | Lesso ................... | H03G 1/0029 |
| 11,009,902 B1 | 5/2021 | Miwa et al. | |
| 2012/0169407 A1 * | 7/2012 | Noh ....................... | G11C 5/145 |
| | | | 327/536 |

(Continued)

FOREIGN PATENT DOCUMENTS

| | | |
|---|---|---|
| EP | 3 591 782 B1 | 5/2021 |
| JP | 6208504 B2 | 10/2017 |
| KR | 10-2021-0033344 A | 3/2021 |

OTHER PUBLICATIONS

Analog Devices, LTC4421: "High Power Prioritized PowerPath Controller", Data Sheet (Rev.A), Nov. 25, 2019. (pp. 1-33).

(Continued)

*Primary Examiner* — Andrea Lindgren Baltzell
*Assistant Examiner* — Jose E Pinero
(74) *Attorney, Agent, or Firm* — NSIP Law

(57) ABSTRACT

A power supply switch circuit includes a first switch configured to supply a first power supply voltage to a power supply terminal of a power amplifier, a control voltage generator configured to compare a first voltage of the power supply terminal with a predetermined first reference voltage to generate a first control voltage higher than the first power supply voltage, and a switch controller configured to use the first control voltage to generate a switching driving signal controlling the first switch.

15 Claims, 10 Drawing Sheets

(56)     References Cited

U.S. PATENT DOCUMENTS

| | | | |
|---|---|---|---|
| 2016/0065060 A1* | 3/2016 | Zhuo ..................... | H02M 3/07 |
| | | | 327/536 |
| 2020/0014239 A1 | 1/2020 | Liu | |
| 2021/0083635 A1 | 3/2021 | Kim et al. | |
| 2021/0126603 A1* | 4/2021 | Itabashi ................ | H03F 3/193 |

OTHER PUBLICATIONS

Korean Office Action issued on Sep. 26, 2025, in corresponding Korean Patent Application No. 10-2021-0133791. (6 pages in English, 6 pages in Korean).

* cited by examiner

FIG. 4

| bit2 | bit1 | $V_{SW1}$ | $V_{SW2}$ | SW1 | SW2 |
|------|------|-----------|-----------|-----|-----|
| 0 | 0 | OFF | OFF | OFF | OFF |
| 0 | 1 | OFF | ON | OFF | ON |
| 1 | 0 | ON | OFF | ON | OFF |
| 1 | 1 | OFF | OFF | OFF | OFF |

FIG. 6A

230a $V_{REF1}$ ○——— +

$V_1$ ○——— −

231a

Oscillator

232a

VCC1   $\Delta V_1$

Charge pump

233a $V_{C1} = VCC1 + \Delta V_1$

FIG. 6B

230b $V_{REF2}$ $V_T$

231b

Oscillator

232b

VCC2  $\Delta V_2$

Charge pump

233b $V_{C2} = VCC2 + \Delta V_2$

FIG. 9

| bit2 | bit1 | $V_{LOG2}$ | $V_{LOG1}$ |
|------|------|------------|------------|
| 0 | 0 | 1 | 1 |
| 0 | 1 | 1 | 0 |
| 1 | 0 | 0 | 1 |
| 1 | 1 | 1 | 1 |

POWER SUPPLY SWITCH CIRCUIT

CROSS-REFERENCE TO RELATED APPLICATION

This application claims the benefit under 35 USC 119(a) of Korean Patent Application No. 10-2021-0133791 filed in the Korean Intellectual Property Office on Oct. 8, 2021, the entire disclosure of which is incorporated herein by reference for all purposes.

BACKGROUND

1. Field

The present description relates to a power supply switch circuit.

2. Description of the Related Art

As wireless communication standards evolve, a plurality of communication standards such as 2G, Wi-Fi, Bluetooth, 3G, 4G, and 5G may be used in one device (for example, a smartphone). As the plurality of communication standards are used in one device, a power amplifier for outputting a transmission signal is used for each communication standard. That is, in order to output a signal conforming to the plurality of communication standards, a plurality of power amplifiers corresponding to the plurality of communication standards may be required.

The power amplifier operates by receiving power from the outside, and in general, a separate power supply integrated circuit (IC) for supplying power to one power amplifier is used. For example, four power supply ICs are used to operate four power amplifiers. However, when one of the plurality of communication standards is used, another communication standard may not be simultaneously used. For example, when the 4G communication standard is used, the 3G communication standard may not be used. Accordingly, a power supply IC corresponding to the unused communication standard needs to be effectively used for other communication standards.

The above information disclosed in this Background section is only for enhancement of understanding of the background of the disclosure, and therefore it may contain information that does not form the prior art.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a power supply switch circuit includes a first switch configured to supply a first power supply voltage to a power supply terminal of a power amplifier, a control voltage generator configured to compare a first voltage of the power supply terminal with a predetermined first reference voltage to generate a first control voltage higher than the first power supply voltage, and a switch controller configured to use the first control voltage to generate a switching driving signal controlling the first switch.

The power supply switch circuit may further include a second switch configured to supply a second power supply voltage to the power supply terminal. The control voltage generator may be further configured to compare the first voltage with a predetermined second reference voltage to generate a second control voltage higher than the second power supply voltage. The switch controller may be further configured to use the second control voltage to generate a switching driving signal controlling the second switch.

The control voltage generator may include a comparator configured to compare the first voltage with the first reference voltage, an oscillator configured to generate a waveform signal in response to an output of the comparator, and a charge pump configured to receive the first power supply voltage, the predetermined second voltage, and the waveform signal to generate the first control voltage.

The first control voltage may be a sum of the first power supply voltage and the second voltage.

The charge pump may be further configured to perform a charge pumping operation until the first voltage becomes the first reference voltage.

The switch controller may include a buffer circuit configured to receive the first control voltage and generate the switching driving signal with the first control voltage.

The first power supply voltage may be configured to vary based on an envelope of a radio frequency (RF) signal inputted to the power amplifier.

The first reference voltage may be lower than the first power supply voltage, and the second reference voltage may be lower than the second power supply voltage.

In another general aspect, a power supply switch circuit includes a first switch connected between a first power supply circuit configured to output a first voltage and a power supply terminal of a power amplifier; a second switch connected between a second power supply circuit configured to output a second voltage and the power supply terminal; a control voltage generator configured to generate a first control voltage higher than the first voltage, and a second control voltage higher than the second voltage using a voltage of the power supply terminal, the first voltage, and the second voltage; and a switch controller configured to generate a first switching driving signal controlling the first switch using the first control voltage, and generate a second switching driving signal controlling the second switch using the second control voltage.

The control voltage generator may include a first control voltage generator configured to generate the first control voltage using the voltage of the power supply terminal, the first voltage, and a predetermined first reference voltage; and a second control voltage generator configured to generate the second control voltage using the voltage of the power supply terminal, the second voltage, and a second predetermined reference voltage.

The first control voltage generator may include a first comparator configured to compare the voltage of the power supply terminal with the first reference voltage; a first oscillator configured to generate a waveform signal in response to an output of the first comparator; and a first charge pump configured to receive the first voltage, a predetermined third voltage, and an output of the first oscillator to generate the first control voltage.

The second control voltage generator may include a second comparator configured to compare the voltage of the power supply terminal with the second reference voltage; a second oscillator configured to generate a waveform signal in response to an output of the second comparator; and a second charge pump configured to receive the second voltage, a predetermined fourth voltage, and an output of the second oscillator to generate the second control voltage.

The first control voltage may be a sum of the first voltage and the third voltage, and the second control voltage may be a sum of the second voltage and the fourth voltage.

The first charge pump may be configured to perform a charge pumping operation until the voltage of the power supply terminal becomes the first reference voltage, and the second charge pump may be configured to perform a charge pumping operation until the voltage of the power supply terminal becomes the second reference voltage.

The switch controller may include a buffer circuit configured to receive the first control voltage and the second control voltage, and generate the first switching driving signal with the first control voltage and the second switching driving signal with the second control voltage.

The first and second voltages may vary based on an envelope of a radio frequency (RF) signal inputted to the power amplifier.

The first reference voltage may be lower than the first voltage, and the second reference voltage may be lower than the second voltage.

Other features and aspects will be apparent from the following detailed description, the drawings, and the claims.

BRIEF DESCRIPTION OF THE DRAWINGS

FIG. 4 illustrates an example of a logic table according to one or more embodiments.

FIG. 6A illustrates an example of an inner configuration of a first control voltage generator according to one or more embodiments, and FIG. 6B illustrates an example of an inner configuration of a second control voltage generator according to one or more embodiments.

FIG. 9 illustrates an input/output logic table of the logic circuit of FIG. 8.

Throughout the drawings and the detailed description, the same reference numerals refer to the same or like elements. The drawings may not be to scale, and the relative size, proportions, and depiction of elements in the drawings may be exaggerated for clarity, illustration, and convenience.

DETAILED DESCRIPTION

Figure 1:
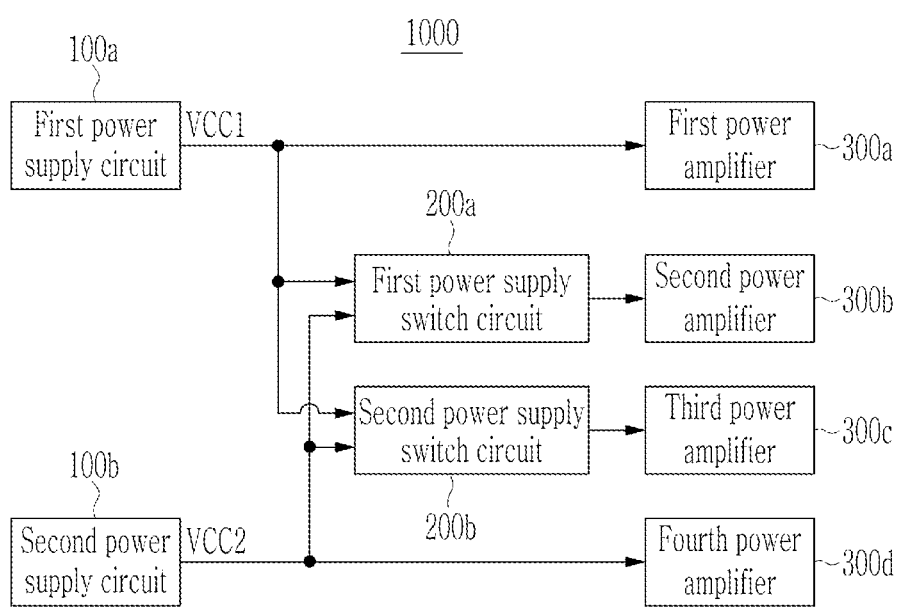
FIG. 1 illustrates an example of a block diagram of a transmitter system according to one or more embodiments.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known after understanding of the disclosure of this application may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes shown in the drawings may occur. Thus, the examples described herein are not limited to the specific shapes shown in the drawings, but include changes in shape that occur during manufacturing.

The features of the examples described herein may be combined in various ways as will be apparent after an understanding of the disclosure of this application. Further, although the examples described herein have a variety of configurations, other configurations are possible as will be apparent after an understanding of the disclosure of this application.

Herein, it is noted that use of the term 'may' with respect to an example or embodiment, e.g., as to what an example or embodiment may include or implement, means that at least one example or embodiment exists where such a feature is included or implemented while all examples and embodiments are not limited thereto.

Throughout the specification, a radio frequency (RF) signal includes Wi-Fi (IEEE 802.11 family, etc.), WiMAX (IEEE 802.16 family, etc.), IEEE 802.20, LTE (long term evolution), Ev-DO, HSPA+, HSDPA+, HSUPA+, EDGE, GSM, GPS, GPRS, CDMA, TDMA, DECT, Bluetooth, 3G, 4G, 5G, and any other wireless and wired protocols designated thereafter, but is not limited thereto.

FIG. 1 illustrates an example of a block diagram of a transmitter system 1000 according to one or more embodiments.

As shown in FIG. 1, the transmitter system 1000, according to one or more embodiments, may include first and second power supply circuits 100a and 100b, first and second power supply switch circuits 200a and 200b, and first to fourth power amplifiers 300a to 300d. FIG. 1 illustrates, as an example, a case in which the transmitter system 1000 is configured with four power amplifiers and the power supply switch circuits related thereto are two, but the number of the power amplifiers and the number of the power supply switch circuits may be changed.

The first power supply circuit 100a generates and outputs a first power supply voltage VCC1. According to one or more embodiments, the first power supply voltage VCC1 may be applied to a power supply terminal of the first power amplifier 300a, the second power amplifier 300b, or the third power amplifier 300c. To support an average power tracking (APT) mode, a value of the first power supply voltage VCC1 may vary according to an envelope of an RF signal inputted to the first power amplifier 300a, the second power amplifier 300b, or the third power amplifier 300c.

The second power supply circuit 100b generates and outputs a second power supply voltage VCC2. According to one or more embodiments, the second power supply voltage VCC2 may be applied to a power supply terminal of the second power amplifier 300b, the third power amplifier 300c, or the fourth power amplifier 300d. To support an average power tracking (APT) mode, a value of the second power supply voltage VCC2 may vary according to an envelope of an RF signal inputted to the second power amplifier 300b, the third power amplifier 300c, or the fourth power amplifier 300d.

In an example, each of the first and second power supply circuits 100a and 100b may be implemented as a power management integrated circuit (PM IC).

The first power supply switch circuit 200a may receive the first power supply voltage VCC1 from the first power supply circuit 100a, and may receive the second power supply voltage VCC2 from the second power supply circuit 100b. The first power supply switch circuit 200a may select one of the input first and second power supply voltages VCC1 and VCC2 to output (supply) it to a power supply terminal of the second power amplifier 300b. For example, when the first power amplifier 300a does not operate, the first power supply switch circuit 200a may select the first power supply voltage VCC1 to output it to a power supply terminal of the second power amplifier 300b. In addition, when the fourth power amplifier 300d does not operate, the first power supply switch circuit 200a may select the second power supply voltage VCC2 to output it to a power supply terminal of the second power amplifier 300b.

The second power supply switch circuit 200b receives the first power supply voltage VCC1 from the first power supply circuit 100a, and receives the second power supply voltage VCC2 from the second power supply circuit 100b. The second power supply switch circuit 200b may select one of the input first and second power supply voltages VCC1 and VCC2 to output (supply) it to a power supply terminal of the third power amplifier 300c. For example, when the first power amplifier 300a does not operate, the second power supply switch circuit 200b may select the first power supply voltage VCC1 to output it to the power supply terminal of the third power amplifier 300c. In addition, when the fourth power amplifier 300d does not operate, the second power supply switch circuit 200b may select the second power supply voltage VCC2 to output it to the power supply terminal of the third power amplifier 300c.

The first power amplifier 300a operates by receiving the first power supply voltage VCC1 from the first power supply circuit 100a, and amplifies and outputs an input radio frequency (RF) signal. The input RF signal of the first power amplifier 300a may be an RF signal for the first communication standard.

The second power amplifier 300b operates by receiving a power supply voltage (that is, first power supply voltage VCC1 or second power supply voltage VCC2) selected by the first power supply switch circuit 200a, and amplifies and outputs an input RF signal. The input RF signal of the second power amplifier 300b may be an RF signal for the second communication standard.

The third power amplifier 300c operates by receiving a power supply voltage (that is, first power supply voltage VCC1 or second power supply voltage VCC2) selected by the second power supply switch circuit 200b, and amplifies and outputs an input RF signal. The input RF signal of the third power amplifier 300c may be an RF signal for the third communication standard.

The fourth power amplifier 300d operates by receiving the second power supply voltage VCC2 from the second power supply circuit 100b, and amplifies and outputs an input radio frequency (RF) signal. The input RF signal of the fourth power amplifier 300d may be an RF signal for the fourth communication standard.

Here, the first to fourth communication standards may be different communication standards, and each thereof may be one of 2G, Wi-Fi, Bluetooth, 3G, 4G, and 5G communication standards. Meanwhile, the first to fourth communication standards may be communication standards that define different bands in the 5G communication standard.

According to this embodiment, the number of power supply circuits may be reduced by sharing the power supply voltage through the power supply switch circuit. For example, generally, when there are four power amplifiers, four power supply circuits are used, but in FIG. 1, the number of the power supply circuits may be reduced to two by using the power supply switch circuit. Hereinafter, a detailed configuration and operation method of a power supply switch circuit, such as the first and second power supply switch circuits 200a and 200b, will be described.

Figure 2:
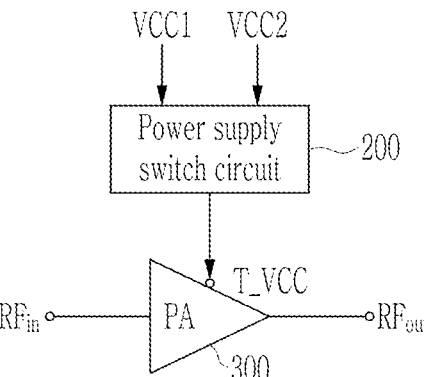
FIG. 2 illustrates an example of a connection relationship between a power supply switch circuit and a power amplifier according to one or more embodiments.

FIG. 2 illustrates a connection relationship between a power supply switch circuit 200 and a power amplifier 300 according to one or more embodiments.

The power supply switch circuit 200 receives the first power supply voltage VCC1 and the second power supply voltage VCC2 as inputs, and selects one of the received first and second power supply voltages VCC1 and VCC2 to output it to a power supply terminal T_VCC of the power amplifier 300. Here, the power supply switch circuit 200 may be the first power supply switch circuit 200a or the second power supply switch circuit 200b of FIG. 1.

In FIG. 1 and FIG. 2, the power supply switch circuit 200 is shown to receive two power supply voltages, but may receive two or more power supply voltages. In this case, the power supply switch circuit 200 may select one of the two or more power supply voltages.

The power amplifier 300 includes an input terminal RFin, an output terminal RFout, and the power supply terminal T_VCC. An RF signal is inputted to the input terminal RFin, and an amplified signal is outputted from the output terminal Rout. The power supply voltage VCC1 or VCC2 is applied to the power supply terminal T_VCC, and the power amplifier 300 is operated by the applied power supply voltage VCC1 or VCC2. The power amplifier 300 may be implemented as a transistor. For example, when the power amplifier 300 is implemented as a bipolar junction transistor (BJT), the input terminal RFin may be a base, and the power supply terminal T_VCC may be a collector or an emitter. Meanwhile, when the power amplifier 300 is implemented as a field effect transistor (FET), the input terminal RFin may be a gate, and the power supply terminal T_VCC may be a drain or a source.

In an example, the power supply switch circuit 200 and the power amplifier 300 of FIG. 2 may be combined to implement a single power amplifier module.

Figure 3:
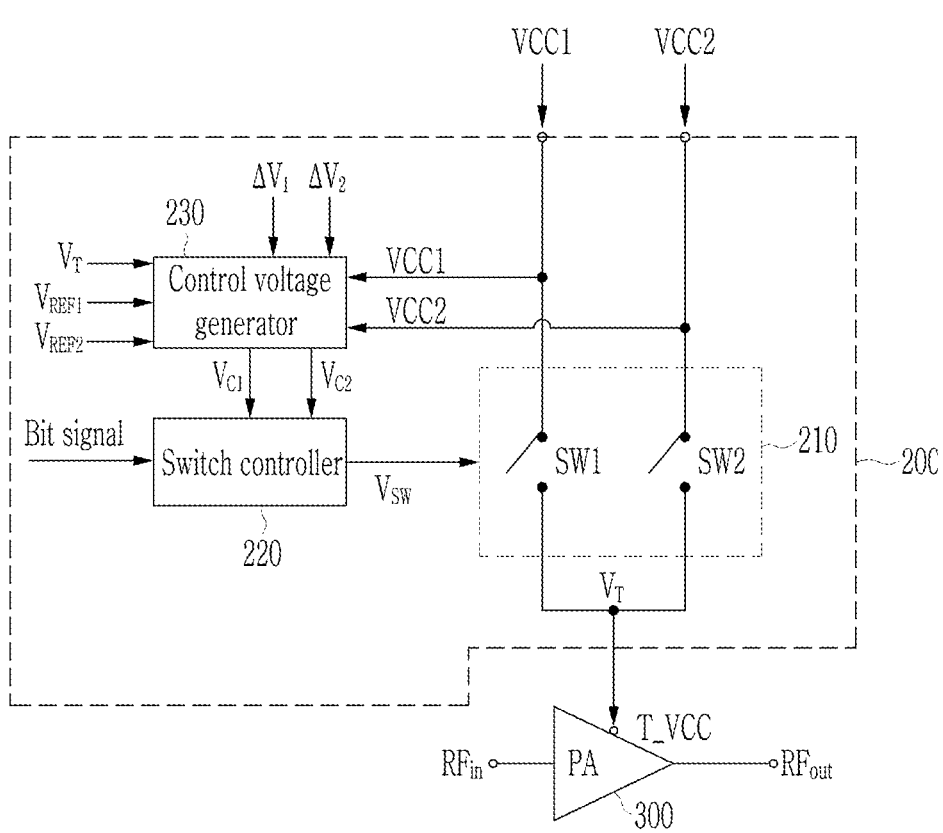
FIG. 3 illustrates an example of an inner configuration of a power supply switch circuit according to one or more embodiments.

FIG. 3 illustrates an inner configuration of the power supply switch circuit 200 according to one or more embodiments.

According to one or more embodiments, as shown in FIG. 3, the power supply switch circuit 200 may include a switch circuit 210, a switch controller 220, and a control voltage generator 230.

The switch circuit 210 may include a first switch SW1 and a second switch SW2. The first switch SW1 may switch supplying of the first power supply voltage VCC1 to the power supply terminal T_VCC of the power amplifier 300. The second switch SW2 may switch supplying of the second power supply voltage VCC2 to the power supply terminal T_VCC of the power amplifier 300. The first switch SW1 may be connected between the first power supply circuit 100a and the power supply terminal T_VCC of the power amplifier 300, and the second switch SW2 may be connected between the second power supply circuit 100b and the power supply terminal T_VCC of the power amplifier 300. Meanwhile, in FIG. 3, a voltage of the power supply terminal T_VCC is denoted as $V_T$, and hereinafter, a voltage of the power supply terminal T_VCC is referred to as a 'power supply terminal voltage $V_T$'.

The switch controller 220 may receive a bit signal (digital signal) from the outside, and may generate a switching driving signal $V_{SW}$ that switches the switch circuit 210 in response to the received bit signal. The generated switching driving signal $V_{SW}$ is outputted to the switch circuit 210. Here, as an example, a bit signal inputted from the outside may be 2 bits. The switching driving signal $V_{SW}$ may include a first switching driving signal $V_{SW1}$ that controls the first switch SW1 and a second switching driving signal $V_{SW2}$ that controls the second switch SW2. The switch controller 220 may receive a first control voltage $V_{C1}$ from the control voltage generator 230, and may generate the first switching driving signal $V_{SW1}$ by using the first control voltage $V_{C1}$. In addition, the switch controller 220 may receive a second control voltage $V_{C2}$ from the control voltage generator 230, and may generate the second switching driving signal $V_{SW2}$ by using the second control voltage $V_{C2}$.

When the first switching driving signal $V_{SW1}$ is an ON driving signal and the second switching driving signal $V_{SW2}$ is an OFF driving signal, the first switch SW1 is turned on and the second switch SW2 is turned off. Accordingly, the first power supply voltage VCC1 is applied to the power supply terminal T_VCC of the power amplifier 300 through the first switch SW1.

When the first switching driving signal $V_{SW1}$ is an OFF driving signal and the second switching driving signal $V_{SW2}$ is an ON driving signal, the first switch SW1 is turned off and the second switch SW2 is turned on. Accordingly, the second power supply voltage VCC2 is applied to the power supply terminal T_VCC of the power amplifier 300 through the second switch SW2.

FIG. 4 illustrates a logic table according to one or more embodiments.

In FIG. 4, bit1 and bit2 are external bit signals inputted to the switch controller 220. As shown in FIG. 4, when the external bit signals are 00 and 11, both the first and second switching driving signal $V_{SW1}$ and $V_{SW2}$ may be an OFF driving signal, and both the first and second switches SW1 and SW2 may be in an OFF state. The switch controller 220 may include a logic circuit with a logic table as shown in FIG. 4, further described below.

As shown in FIG. 3, the control voltage generator 230 receives the first power supply voltage VCC1 from the first power supply circuit 100a and the second power supply voltage VCC2 from the second power supply circuit 100b. In addition, the control voltage generator 230 also receives a first excess voltage $\Delta V_1$, a second excess voltage $\Delta V_2$, a power supply terminal voltage $V_T$, a first reference voltage $V_{REF1}$, and a second reference voltage $V_{REF2}$. The control voltage generator 230 generates a first control voltage $V_{C1}$ by using the first power supply voltage VCC1, the first excess voltage $\Delta V_1$, the power supply terminal voltage $V_T$, and the first reference voltage $V_{REF1}$. The control voltage generator 230 generates a second control voltage $V_{C2}$ by using the second power supply voltage VCC2, the second excess voltage $\Delta V_2$, the power supply terminal voltage $V_T$, and the second reference voltage $V_{REF2}$. The first and second control voltages $V_{C1}$ and $V_{C2}$ generated by the control voltage generator 230 are inputted to the switch controller 220. The first control voltage $V_{C1}$ may be a control voltage (for example, gate voltage) for switching the first switch SW1, and the second control voltage $V_{C2}$ may be a control voltage (for example, gate voltage) for switching the second switch SW2.

Figure 5:
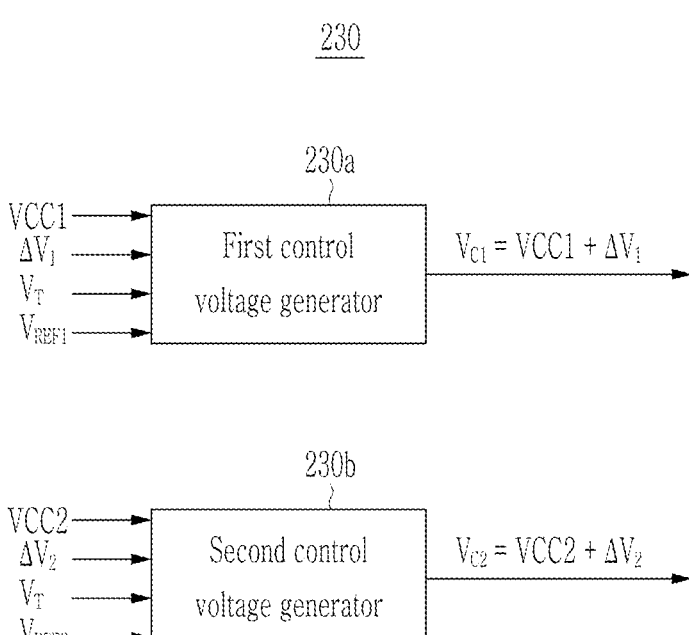
FIG. 5 illustrates an example of a control voltage generator according to one or more embodiments.

FIG. 5 illustrates the control voltage generator 230 according to one or more embodiments.

As shown in FIG. 5, the control voltage generator 230 may include a first control voltage generator 230a and a second control voltage generator 230b.

The first control voltage generator 230a receives the first power supply voltage VCC1, the first excess voltage $\Delta V_1$, the power supply terminal voltage $V_T$, and the first reference voltage $V_{REF1}$, and generates the first control voltage $V_{C1}$ by using them. In more detail, the first control voltage generator 230a compares the received power supply terminal voltage $V_T$ and the first reference voltage $V_{REF1}$, and operates an inner charge pump according to the compared result, thereby generating the first control voltage $V_{C1}$. Here, the first control voltage $V_{C1}$ may be a sum (VCC1-$\Delta V_1$) of the first power supply voltage VCC1 and the first excess voltage $\Delta V_1$. The first excess voltage $\Delta V_1$ is an arbitrarily set voltage, and may be 3 V as an example. The first excess voltage $\Delta V_1$ may be implemented through a regulator such as a low dropout (LDO). The first reference voltage $V_{REF1}$ is an arbitrarily set voltage, and may be an actual voltage (that is, a voltage considering a voltage drop of the first switch SW1) to be supplied to the power supply terminal T_VCC through the power supply switch circuit 200. The first reference voltage $V_{REF1}$ may be slightly lower than the first power supply voltage VCC1. As an example, the first reference voltage $V_{REF1}$ may be a voltage (VCC1-0.2 V) that is 0.2 V lower than the first power supply voltage VCC1.

The second control voltage generator 230b receives the second power supply voltage VCC2, the second excess voltage $\Delta V_2$, the power supply terminal voltage $V_T$, and the second reference voltage $V_{REF2}$, and generates the second control voltage $V_{C2}$ by by using them. In more detail, the second control voltage generator 230b compares the received power supply terminal voltage $V_T$ and second reference voltage $V_{REF2}$, and operates an inner charge pump according to the compared result, thereby generating the second control voltage $V_{C2}$. Here, the second control voltage $V_{C2}$ may be a sum (VCC2+$\Delta V_2$) of the second power supply voltage VCC2 and the second excess voltage $\Delta V_2$. The second excess voltage $\Delta V_2$ is an arbitrarily set voltage, and may be 3 V as an example. The second excess voltage $\Delta V_2$ may also be implemented through a regulator such as a low dropout (LDO). The second excess voltage $\Delta V_2$ may be the same as the first excess voltage $\Delta V_1$. The second reference voltage $V_{REF2}$ is an arbitrarily set voltage, and may be an actual voltage (that is, a voltage considering a voltage drop of the second switch SW2) to be supplied to the power supply terminal T_VCC through the power supply switch circuit 200. The second reference voltage $V_{REF2}$ may be slightly lower than the second power supply voltage VCC2. As an example, the second reference voltage $V_{REF2}$ may be a voltage (VCC2-0.2 V) that is 0.2 V lower than the second power supply voltage VCC2.

Figure 6A:
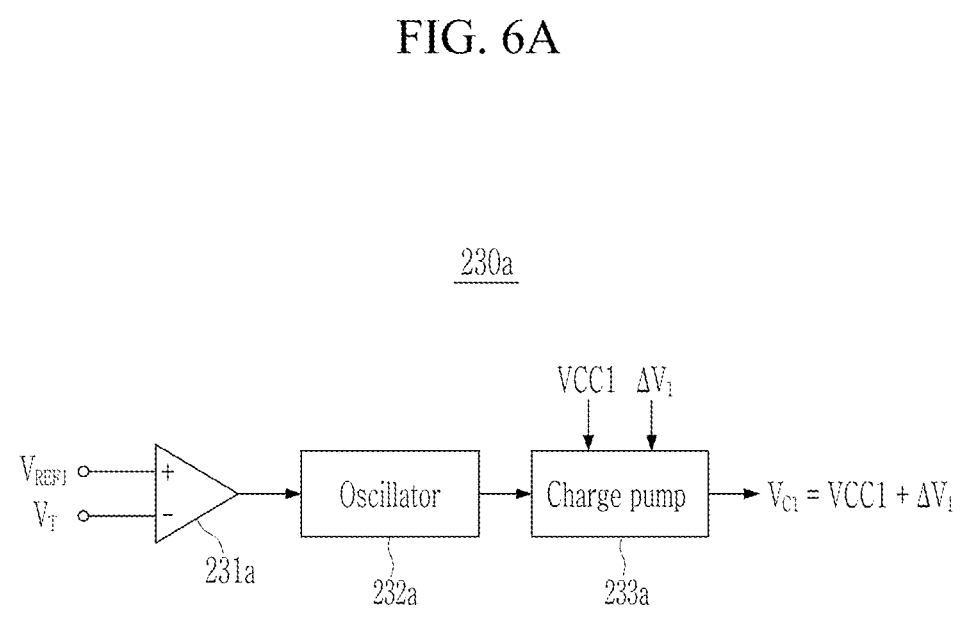
Figure 6B:
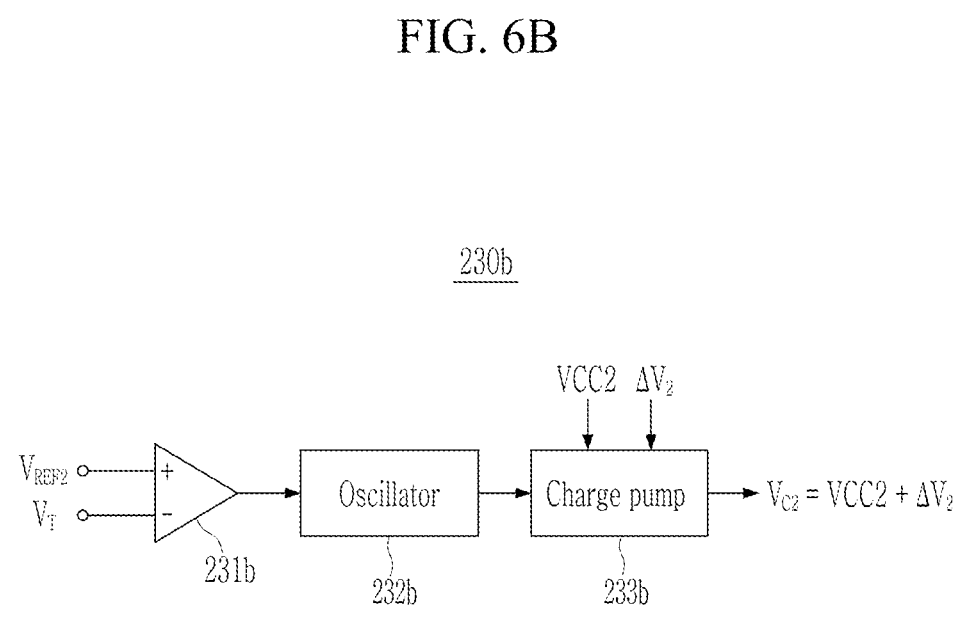

FIG. 6A illustrates an inner configuration of the first control voltage generator 230a according to one or more embodiments, and FIG. 6B illustrates an inner configuration of the second control voltage generator 230b according to one or more embodiments.

As shown in FIG. 6A, the first control voltage generator 230a, according to one or more embodiments, may include a comparator 231a, an oscillator 232a, and a charge pump 233a.

The first reference voltage $V_{REF1}$ is inputted to a non-inverting terminal (+) of the comparator 231a, and the power supply terminal voltage $V_T$ is inputted to the inverting terminal (−) of the comparator 231a. The comparator 231a compares the first reference voltage $V_{REF1}$ and the power supply terminal voltage $V_T$. When the first reference voltage $V_{REF1}$ is higher than the power supply terminal voltage $V_T$, the comparator 231a outputs a high signal. In addition, when the power supply terminal voltage $V_T$ is higher than the first reference voltage $V_{REF1}$, the comparator 231a outputs a low signal. Meanwhile, when the first switch SW1 is an n-type transistor, the comparator 231a may start a comparison operation when an enable signal of the first switch SW1 is inputted. In addition, when the first switch SW1 is a p-type transistor, the comparator 231a may start a comparison operation when a disable signal of the first switch SW1 is inputted.

The oscillator 232a receives an output of the comparator 231a, and generates a square wave in response to the output of the comparator 231a. When the output of the comparator 231a is a high signal, the oscillator 232a operates to generate a square wave. In addition, when the output of the comparator 231a is a low signal, the oscillator 232a does not operate and does not generate a square wave. That is, the oscillator 232a operates until the power supply terminal voltage $V_T$ becomes the first reference voltage $V_{REF1}$, and generates and outputs a square wave.

The charge pump 233a receives the output of the oscillator 232a, and receives the first power supply voltage VCC1 and the first excess voltage $\Delta V_1$. When a square wave is inputted thereto from the oscillator 232a, the charge pump 233a performs an operation. Accordingly, the charge pump 233a outputs a voltage (VCC1+$\Delta V_1$) corresponding to a sum of the first power supply voltage VCC1 and the first excess voltage $\Delta V_1$ as the first control voltage $V_{C1}$. In other words, the charge pump 233a continues to perform a charge pumping operation until the power supply terminal voltage $V_T$ becomes the first reference voltage $V_{REF1}$. A specific method in which the charge pump 233a generates the first control voltage $V_{C1}$ by using a square wave inputted from the oscillator 232a will be apparent after an understanding of the disclosure of this application, so a detailed description thereof will be omitted.

Here, a relationship between the first control voltage $V_{C1}$ and the first power supply voltage VCC1 may satisfy Equation 1 below.

$$V_{C1} = VCC1 + \Delta V_1 \qquad \text{Equation 1:}$$

As shown in Equation 1, the first control voltage $V_{C1}$ may be set to a higher voltage than the first power supply voltage VCC1 by the first excess voltage $\Delta V_1$. The first control voltage $V_{C1}$ is a voltage used to switch the first switch SW1, so the first switch SW1 may be sufficiently turned on or turned off. For example, in a case in which the first switch SW1 is implemented as an n-type transistor, only when a voltage of the first switching driving signal $V_{SW1}$ is set to be higher than the first power supply voltage VCC1, may the first switch SW1 be sufficiently turned on. In addition, in a case in which the first switch SW1 is implemented as a p-type transistor, only when a voltage of the first switching driving signal $V_{SW1}$ is set to be higher than the first power supply voltage VCC1, may the first switch SW1 be sufficiently turned off. Accordingly, according to one or more embodiments, the first control voltage generator 230a generates the first control voltage $V_{C1}$ higher than the first power supply voltage VCC1 to output it to the switch controller 220.

As shown in FIG. 6B, the second control voltage generator 230b, according to one or more embodiments, may include a comparator 231b, an oscillator 232b, and a charge pump 233b.

The second reference voltage $V_{REF2}$ is inputted to a non-inverting terminal (+) of the comparator 231b, and the power supply terminal voltage $V_T$ is inputted to the inverting terminal (−) of the comparator 231b. The comparator 231b compares the second reference voltage $V_{REF2}$ and the power supply terminal voltage $V_T$. When the second reference voltage $V_{REF2}$ is higher than the power supply terminal voltage $V_T$, the comparator 231b outputs a high signal. In addition, when the power supply terminal voltage $V_T$ is higher than the second reference voltage $V_{REF2}$, the comparator 231b outputs a low signal. Meanwhile, when the second switch SW2 is an n-type transistor, the comparator 231b may start a comparison operation when an enable signal of the second switch SW2 is inputted. In addition, when the second switch SW2 is a p-type transistor, the comparator 231*b* may start a comparison operation when a disable signal of the second switch SW2 is inputted.

The oscillator 232*b* receives an output of the comparator 231*b*, and generates a square wave in response to the output of the comparator 231*b*. When the output of the comparator 231*b* is a high signal, the oscillator 232*b* operates to generate a square wave. In addition, when the output of the comparator 231*b* is a low signal, the oscillator 232*b* does not operate and does not generate a square wave. That is, the oscillator 232*b* operates until the power supply terminal voltage $V_T$ becomes the second reference voltage $V_{REF2}$, and generates and outputs a square wave.

The charge pump 233*b* receives the output of the oscillator 232*b*, and receives the second power supply voltage VCC2 and the second excess voltage $\Delta V_2$. When a square wave is inputted thereto from the oscillator 232*b*, the charge pump 233*b* performs an operation. Accordingly, the charge pump 233*b* outputs a voltage (VCC2+$\Delta V_2$) corresponding to a sum of the second power supply voltage VCC2 and the second excess voltage $\Delta V_2$ as the second control voltage $V_{C2}$. In other words, the charge pump 233*b* continues to perform a charge pumping operation until the power supply terminal voltage $V_T$ becomes the second reference voltage $V_{REF2}$. A specific method in which the charge pump 233*b* generates the second control voltage $V_{C2}$ by using a square wave inputted from the oscillator 232*b* will be apparent after an understanding of the disclosure of this application, so a detailed description thereof will be omitted.

Here, a relationship between the second control voltage $V_{C2}$ and the second power supply voltage VCC2 may satisfy Equation 2 below.

$$V_{C2}=VCC2+\Delta V_2 \qquad \text{Equation 2:}$$

As shown in Equation 2, the second control voltage $V_{C2}$ may be set to a voltage that is higher than the second power supply voltage VCC2 by the second excess voltage $\Delta V_2$. The second control voltage $V_{C2}$ is a voltage used to switch the second switch SW2, so the second switch SW2 may be sufficiently turned on or turn off. For example, in a case in which the second switch SW2 is implemented as an n-type transistor, only when a voltage of the second switching driving signal $V_{SW2}$ is set to be higher than the second power supply voltage VCC2, may the second switch SW2 be sufficiently turned on. In addition, in a case in which the second switch SW2 is implemented as a p-type transistor, only when a voltage of the second switching driving signal $V_{SW2}$ is set to be higher than the second power supply voltage VCC2, may the second switch SW2 be sufficiently turned off. Accordingly, the second control voltage generator 230*b*, according to one or more embodiments, generates the second control voltage $V_{C2}$ that is higher than the second power supply voltage VCC2 to output it to the switch controller 220.

Figure 7:
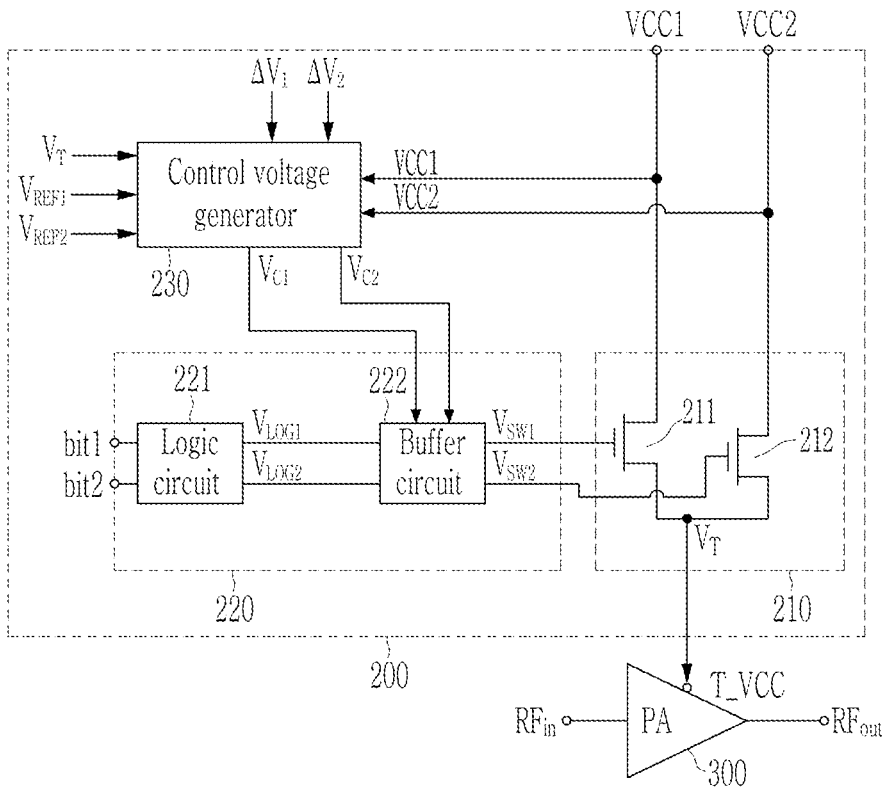
FIG. 7 illustrates an example of an inner configuration of a switch circuit and an inner configuration of a switch controller according to one or more embodiments.

FIG. 7 illustrates an inner configuration of the switch circuit 210 and an inner configuration of the switch controller 220 according to one or more embodiments.

As shown in FIG. 7, the switch controller 220 may include a logic circuit 221 and a buffer circuit 222.

The logic circuit 221 receives external bit signals bit1 and bit2, and corresponds to the bit signals bit1 and bit2 to generate and output logic signals $V_{LOG1}$ and $V_{LOG2}$. The first bit signal bit1 and the first logic signal $V_{LOG1}$ are used to control the first switch SW1, and the second bit signal bit2 and the second logic signal $V_{LOG2}$ are used to control the second switch SW2.

Figure 8:
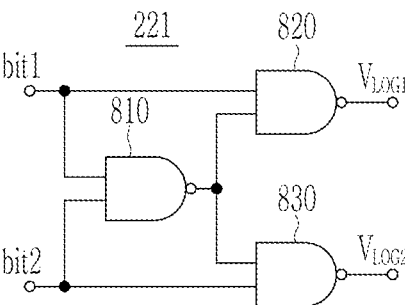
FIG. 8 illustrates an example of a logic circuit according to one or more embodiments.

FIG. 8 illustrates the logic circuit 221 according to one or more embodiments.

As shown in FIG. 8, the logic circuit 221, according to one or more embodiments, may include a first NAND gate 810, a second NAND gate 820, and a third NAND gate 830.

The first NAND gate 810 receives the first bit signal bit1 and the second bit signal bit2. The second NAND gate 820 receives the first bit signal bit1 and an output of the first NAND gate 810, and outputs the first logic signal $V_{LOG1}$. In addition, the third NAND gate 830 receives the second bit signal bit2 and the output of the first NAND gate 810, and outputs the second logic signal $V_{LOG2}$.

FIG. 9 illustrates an input/output logic table of the logic circuit 221 of FIG. 8.

As shown in FIG. 9, the logic circuit 221 may generate and output four states in response to two bit signals. When the first logic signal $V_{LOG1}$ is 1, it means a high level, and in this case, the first switch SW1 may be turned off. In contrast, when the first logic signal $V_{LOG1}$ is 0, it means a low level, and in this case, the first switch SW1 may be turned on. Accordingly, at the high levels of the first and second logic signals $V_{LOG1}$ and $V_{LOG2}$, the first and second switches SW1 and SW2 are turned off, and at the low levels of the first and second logic signals $V_{LOG1}$ and $V_{LOG2}$, the first and second switches SW1 and SW2 are turned on. That is, since the first logic signal $V_{LOG1}$ becomes a low level in a bit signal of 01, the first switch SW1 is turned on. Then, since the second logic signal $V_{LOG2}$ becomes a low level in a bit signal of 10, the second switch SW2 is turned on. In the remaining cases, since the first and second logic signals $V_{LOG1}$ and $V_{LOG2}$ become high levels, both the first and second switches SW1 and SW2 are turned off.

The buffer circuit 222 may receive the first and second logic signals $V_{LOG1}$ and $V_{LOG2}$ from the logic circuit 221, and may generate and output the switching driving signals $V_{SW1}$ and $V_{SW2}$. The buffer circuit 222 converts the first logic signal $V_{LOG1}$ into the first switching driving signal $V_{SW1}$, and converts the second logic signal $V_{LOG2}$ into the second switching driving signal $V_{SW2}$. Since the first logic signal $V_{LOG1}$ and the second logic signal $V_{LOG2}$ are logic signals, current levels thereof are low. Accordingly, the buffer circuit 222 converts the first logic signal $V_{LOG1}$ and the second logic signal $V_{LOG2}$ into the first switching driving signal $V_{SW1}$ and the second switching driving signal $V_{SW2}$ having high current levels, respectively. Meanwhile, the buffer circuit 222 may further include a level shifter circuit as well as a buffer to increase a voltage level as well as a current level. The buffer circuit 222, according to one or more embodiments, receives the first control voltage $V_{C1}$ from the control voltage generator 230, and generates the first switching driving signal $V_{SW1}$ by using the first control voltage $V_{C1}$. When the first switching driving signal $V_{SW1}$ has a high voltage level, the first switching driving signal $V_{SW1}$ may be the first control voltage $V_{C1}$. In addition, the buffer circuit 222 receives the second control voltage $V_{C2}$ from the control voltage generator 230, and generates the second switching driving signal $V_{SW2}$ by using the second control voltage $V_{C2}$. When the second switching driving signal $V_{SW2}$ has a high voltage level, the second switching driving signal $V_{SW2}$ may be the second control voltage $V_{C2}$. When the first and second switches SW1 and SW2 are implemented as n-type transistors, the buffer circuit 222 may output the first and second switching driving signals $V_{SW1}$ and $V_{SW2}$, respectively, having the first and second control voltages $V_{C1}$ and $V_{C2}$ as an ON driving signal. In this case, the first and second switches SW1 and SW2 are turned on. When the first and second switches SW1 and SW2 are implemented as p-type transistors, the buffer circuit 222 may output the first and second switching driving signals $V_{SW1}$ and $V_{SW2}$, respectively, having the first and second control voltages $V_{C1}$ and $V_{C2}$ as an OFF driving signal. In this case, the first and second switches SW1 and SW2 are turned off. A method in which the buffer circuit 222 generates the first and second switching driving signals $V_{SW1}$ and $V_{SW2}$ by using the first and second control voltages $V_{C1}$ and $V_{C2}$ will be apparent after an understanding of the disclosure of this application, so a detailed description thereof will be omitted.

As shown in FIG. 7, in the switch circuit 210, the first and second switches SW1 and SW2 may be implemented with transistors 211 and 212, respectively. As an example, the transistor 211 may be an n-type or p-type of field effect transistor (FET), and the second transistor 212 may also be an n-type or p-type of FET.

A first terminal of the transistor 211 is connected to the first power supply circuit 100a to receive (be supplied with) the first power supply voltage VCC1, and a second terminal of the transistor 211 is connected to the power supply terminal T_VCC. A control terminal of the transistor 211 receives the first switching driving signal $V_{SW1}$ from the buffer circuit 222. A first terminal of the transistor 212 is connected to the second power supply circuit 100b to receive (be supplied with) the second power supply voltage VCC2, and a second terminal of the transistor 212 is connected to the power supply terminal T_VCC. A control terminal of the transistor 212 receives the second switching driving signal $V_{SW2}$ from the buffer circuit 222.

When the transistor 211 is an n-type transistor, the buffer circuit 220 may output the first control voltage $V_{C1}$ as the first switching driving signal $V_{SW1}$ so as to turn on the transistor 211. In addition, when the transistor 212 is an n-type transistor, the buffer circuit 220 may output the second control voltage $V_{C2}$ as the second switching driving signal $V_{SW2}$ so as to turn on the transistor 212. Through this, the n-type transistors 211 and 212 may be sufficiently turned on. When the control voltage of the n-type transistors 211 and 212 are lower than the voltage of the first terminal thereof or the voltage of the second terminal thereof, the n-type transistors 211 and 212 operate in the turn-off region, so that on-resistance thereof may increase. To solve this problem, the control voltage generator 230 generates the first and second control voltages $V_{C1}$ and $V_{C2}$ that are higher than the first and second power supply voltages VCC1 and VCC2, respectively. The buffer circuit 222 generates the first and second control voltages $V_{C1}$ and $V_{C2}$ as the control voltages of the n-type transistors 211 and 212, respectively. That is, the first control voltage $V_{C1}$ may be an ON control voltage of the n-type transistor 211, and the second control voltage $V_{C2}$ may be an ON control voltage of the n-type transistor 212.

When the transistor 211 is a p-type transistor, the buffer circuit 220 may output the first control voltage $V_{C1}$ as the first switching driving signal $V_{SW1}$ so as to turn off the transistor 211. In addition, when the transistor 212 is a p-type transistor, the buffer circuit 220 may output the second control voltage $V_{C2}$ as the second switching driving signal $V_{SW2}$ so as to turn off the transistor 212. Through this, the p-type transistors 211 and 212 may be sufficiently turned off. When the control voltage of the p-type transistors 211 and 212 are lower than the voltage of the first terminal thereof or the voltage of the second terminal thereof, the p-type transistors 211 and 212 are not sufficiently turned off, so that a leakage current may occur. To solve this problem, the control voltage generator 230 generates the first and second control voltages $V_{C1}$ and $V_{C2}$ that are higher than the first and second power supply voltages VCC1 and VCC2, respectively. The buffer circuit 222 generates the first and second control voltages $V_{C1}$ and $V_{C2}$ as the control voltages of the p-type transistors 211 and 212, respectively. That is, the first control voltage $V_{C1}$ may be an OFF control voltage of the p-type transistor 211, and the second control voltage $V_{C2}$ may be an OFF control voltage of the p-type transistor 212.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A power supply switch circuit, comprising:
   a first switch configured to supply a first power supply voltage to a power supply terminal of a power amplifier;
   a control voltage generator configured to compare a first voltage with a predetermined first reference voltage to generate a first control voltage higher than the first power supply voltage, wherein the first voltage is a voltage at the power supply terminal; and
   a switch controller configured to use the first control voltage to generate a switching driving signal controlling the first switch,
   wherein the switch controller comprises a buffer circuit configured to receive the first control voltage and generate the switching driving signal with the first control voltage.

2. The power supply switch circuit of claim 1, further comprising:
   a second switch configured to supply a second power supply voltage to the power supply terminal,
   wherein the control voltage generator is further configured to compare the first voltage with a predetermined second reference voltage to generate a second control voltage higher than the second power supply voltage, and
   the switch controller is further configured to use the second control voltage to generate a switching driving signal controlling the second switch.

3. The power supply switch circuit of claim 1, wherein the control voltage generator comprises:
   a comparator configured to compare the first voltage with the first reference voltage;
   an oscillator configured to generate a waveform signal in response to an output of the comparator; and
   a charge pump configured to receive the first power supply voltage, the predetermined second voltage, and the waveform signal to generate the first control voltage.

4. The power supply switch circuit of claim 3, wherein the first control voltage is a sum of the first power supply voltage and the second voltage.

5. The power supply switch circuit of claim 3, wherein the charge pump is further configured to perform a charge pumping operation until the first voltage becomes the first reference voltage.

6. The power supply switch circuit of claim 1, wherein the first power supply voltage is configured to vary based on an envelope of a radio frequency (RF) signal inputted to the power amplifier.

7. The power supply switch circuit of claim 2, wherein the first reference voltage is lower than the first power supply voltage, and the second reference voltage is lower than the second power supply voltage.

8. A power supply switch circuit, comprising:
a first switch connected between a first power supply circuit configured to output a first voltage and a power supply terminal of a power amplifier;
a second switch connected between a second power supply circuit configured to output a second voltage and the power supply terminal;
a control voltage generator configured to generate a first control voltage higher than the first voltage, and a second control voltage higher than the second voltage using a voltage of the power supply terminal, the first voltage, and the second voltage, wherein the voltage of the power supply terminal is a voltage at the power supply terminal; and
a switch controller configured to generate a first switching driving signal controlling the first switch using the first control voltage, and generate a second switching driving signal controlling the second switch using the second control voltage,
the switch controller comprises a buffer circuit configured to receive the first control voltage and the second control voltage, and generate the first switching driving signal with the first control voltage and the second switching driving signal with the second control voltage.

9. The power supply switch circuit of claim 8, wherein the control voltage generator comprises:
a first control voltage generator configured to generate the first control voltage using the voltage of the power supply terminal, the first voltage, and a predetermined first reference voltage; and
a second control voltage generator configured to generate the second control voltage using the voltage of the power supply terminal, the second voltage, and a second predetermined reference voltage.

10. The power supply switch circuit of claim 9, wherein the first control voltage generator comprises:
a first comparator configured to compare the voltage of the power supply terminal with the first reference voltage;
a first oscillator configured to generate a waveform signal in response to an output of the first comparator; and
a first charge pump configured to receive the first voltage, a predetermined third voltage, and an output of the first oscillator to generate the first control voltage.

11. The power supply switch circuit of claim 10, wherein the second control voltage generator comprises:
a second comparator configured to compare the voltage of the power supply terminal with the second reference voltage;
a second oscillator configured to generate a waveform signal in response to an output of the second comparator; and
a second charge pump configured to receive the second voltage, a predetermined fourth voltage, and an output of the second oscillator to generate the second control voltage.

12. The power supply switch circuit of claim 11, wherein the first control voltage is a sum of the first voltage and the third voltage, and the second control voltage is a sum of the second voltage and the fourth voltage.

13. The power supply switch circuit of claim 11, wherein the first charge pump is configured to perform a charge pumping operation until the voltage of the power supply terminal becomes the first reference voltage, and
the second charge pump is configured to perform a charge pumping operation until the voltage of the power supply terminal becomes the second reference voltage.

14. The power supply switch circuit of claim 8, wherein the first and second voltages vary based on an envelope of a radio frequency (RF) signal inputted to the power amplifier.

15. The power supply switch circuit of claim 9, wherein the first reference voltage is lower than the first voltage, and the second reference voltage is lower than the second voltage.

\* \* \* \* \*